United States Patent
Martínez Chapa et al.

(10) Patent No.: US 11,813,676 B2
(45) Date of Patent: Nov. 14, 2023

(54) MIGRATION OF NANO METALS IN SEMISOLID AND SOLID MATRIX UNDER THE INFLUENCE OF SELECTIVELY TRIGGERED HETEROGENEOUS NUCLEATION AND GROWTH

(71) Applicant: Instituto Tecnológico y de Estudios Superiores de Monterrey, Monterrey (MX)

(72) Inventors: Sergio Omar Martínez Chapa, Monterrey (MX); Gaurav Chauhan, Monterrey (MX); Marc J. Madou, Monterrey (MX); Manish Madhukar Kulkarni, Monterrey (MX); Vianni Chopra, Monterrey (MX)

(73) Assignee: INSTITUTO TECNOLÓGICO Y DE ESTUDIOS SUPERIORES DE MONTERREY, Monterrey (MX)

( * ) Notice: Subject to any disclaimer, the term of this patent is extended or adjusted under 35 U.S.C. 154(b) by 234 days.

(21) Appl. No.: 16/789,510

(22) Filed: Feb. 13, 2020

(65) Prior Publication Data

US 2020/0255287 A1    Aug. 13, 2020

Related U.S. Application Data

(60) Provisional application No. 62/805,138, filed on Feb. 13, 2019.

(51) Int. Cl.
*B22F 9/30* (2006.01)
*B81C 1/00* (2006.01)
(Continued)

(52) U.S. Cl.
CPC ............... *B22F 9/30* (2013.01); *B22F 1/054* (2022.01); *B22F 9/14* (2013.01); *B22F 9/18* (2013.01);
(Continued)

(58) Field of Classification Search
None
See application file for complete search history.

(56) References Cited

U.S. PATENT DOCUMENTS

| | | | | |
|---|---|---|---|---|
| 2003/0177868 | A1* | 9/2003 | Guillet | C08F 220/06 75/722 |
| 2009/0206520 | A1* | 8/2009 | Park | G03F 7/0388 264/401 |
| 2013/0183833 | A1* | 7/2013 | Duan | B23K 26/0613 438/778 |

FOREIGN PATENT DOCUMENTS

| | | | |
|---|---|---|---|
| CN | 110586182 A | * | 12/2019 |
| WO | WO-2009/109685 A1 | * | 9/2009 |
| WO | WO-2013/003836 A2 | * | 1/2013 |

OTHER PUBLICATIONS

English translation of WO-2009/109685 (originally published Sep. 11, 2009) from PE2E search.*

(Continued)

*Primary Examiner* — George Wyszomierski
(74) *Attorney, Agent, or Firm* — NIXON & VANDERHYE

(57) ABSTRACT

Use of heterogeneous nucleation allows the localized reduction of metal salt and also cross-link the carbon precursor in the same region. This cross-linked matrix act as the secondary heterogeneous sites for spontaneous Nano particle synthesis and growth during the process of pyrolysis. Selectively creating heterogeneous sites and reducing the metal precursor using highly focused energy beams create various metal-carbon composites with controlled metal positioning. This is such a unique process where a pretreatment process will control the fabrication of complex metal-carbon composite nano and microstructures. This greatly simplifies the fabrication process, facilitating nanostructures like Nano metal bulbs, nanometal pointed nanogaps and metal sand- (Continued)

Schematic of the basic mechanism representing the use of focused energy beam to create heterogeneous nucleation sites.

wich structures with such process. With several advantages ranging from electronics, catalysis, optics and several other bio-functionalization technologies, this enables materials with unique and hybrid advantages. Moreover, fabrication of micro and Nano level structures provides a CMEMS and BIOMEMS relevant approach for wide range of applications.

5 Claims, 3 Drawing Sheets

(51) Int. Cl.
- *B22F 9/14* (2006.01)
- *B22F 9/18* (2006.01)
- *B22F 1/054* (2022.01)

(52) U.S. Cl.
CPC .. *B81C 1/00007* (2013.01); *B81C 2201/0149* (2013.01)

(56) References Cited

OTHER PUBLICATIONS

Sanchez-Dominguez, M. et al., "A novel approach to metal and metal oxide nanoparticle synthesis: he oil-in-water microemulsion reaction method", J of Nanoparticle Research, vol. 11, pp. 1823-1829, Published online Jun. 13, 2009.*

English translation of CN 110586182 (originally published Dec. 20, 2019), obtained from PE2E search.*

* cited by examiner

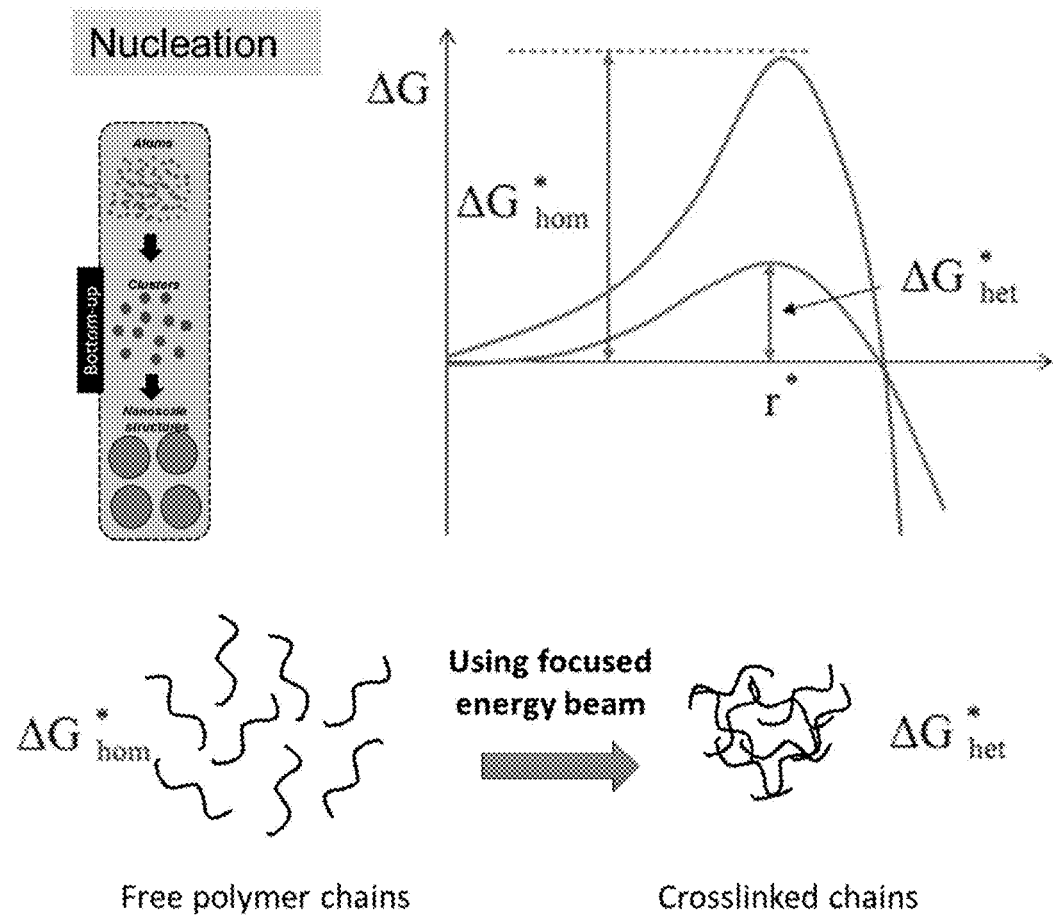
Figure 1. *Schematic of the basic mechanism representing the use of focused energy beam to create heterogeneous nucleation sites.*

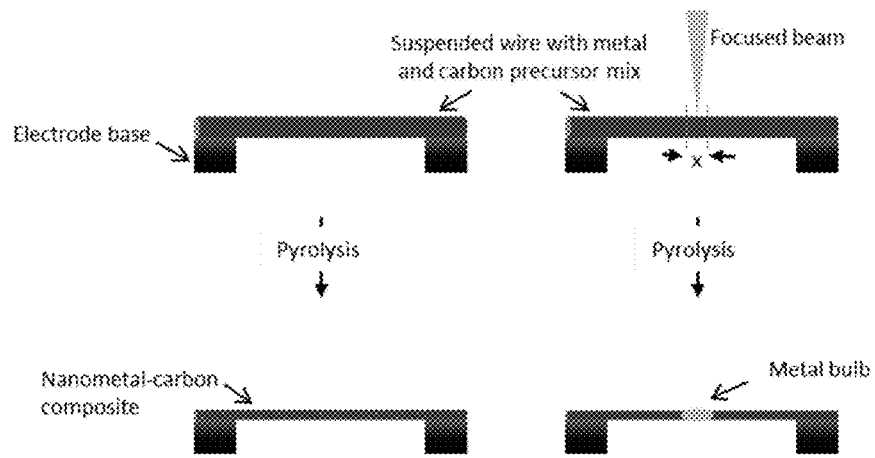
Figure 2. *Schematic of the Nano-bulb fabrication process on a nanofiber.*
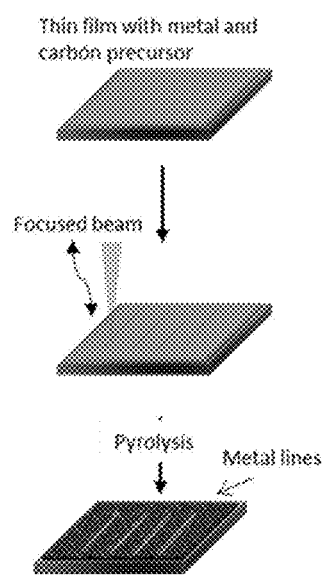
Figure 3. *Schematic of the nano-metal writing on precursor thin films.*

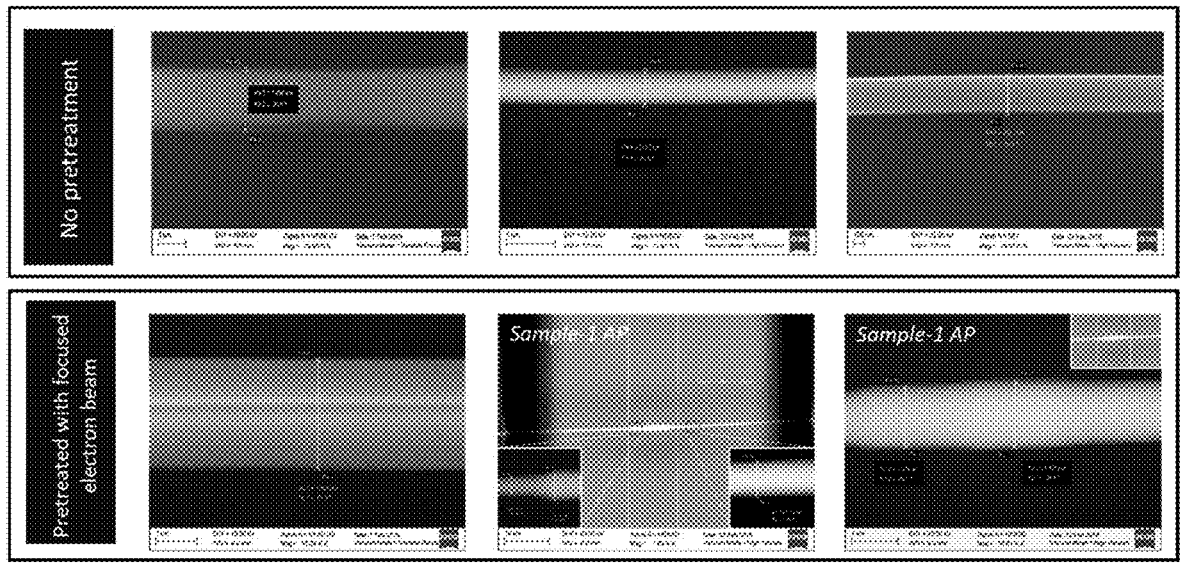
Figure 4. *Scanning electron microscopy of the gold Nano-bulbs fabricated in the carbon nanofibers.*
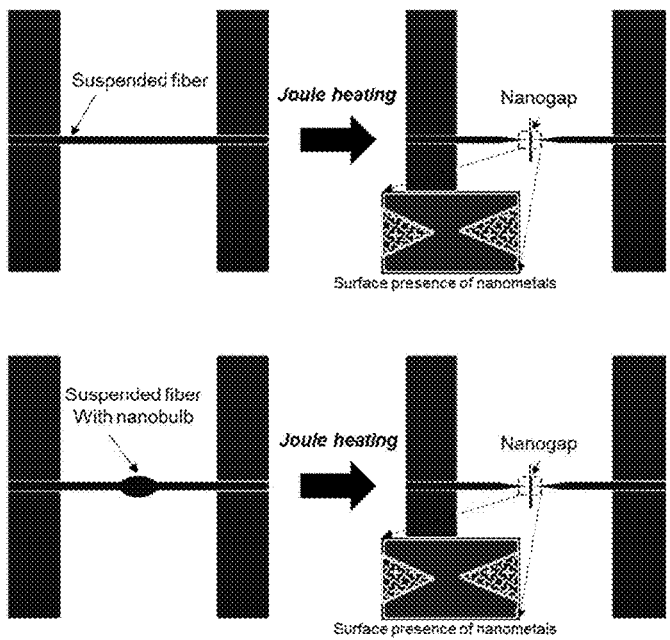
Figure 5. *Nanometal decorated nanogaps created by two different methods where the properties and surface composition of nanogaps is controlled by inducing metal accumulated nanogaps in the center of suspended carbon based nanofiber.*

MIGRATION OF NANO METALS IN SEMISOLID AND SOLID MATRIX UNDER THE INFLUENCE OF SELECTIVELY TRIGGERED HETEROGENEOUS NUCLEATION AND GROWTH

OBJECT OF THE INVENTION

The invention discloses a novel technique for the selective accumulation of the nano-metals in a semisolid and solid matrix, where the substrate composition is pretreated by focused energy source to initiate the reduction of metal precursor as well as creating heterogeneous sites to increase the kinetics of nucleation and growth. Energy sources includes focused electron and photon (two or three photons) beams that provides a precisely controllable pretreatment for nano and micro sized features. This approach is precisely controllable depending on the process optimization and accuracy of the energy source used. This invention unlocks the possibility to fabricate metal-carbon composites with different structures and configurations both at nano, mico as well as macro scales. Some of the finest outcomes with this technology is the creation of metal-carbon composite based nano and mico bulb, metal-carbon sandwich, metal-carbon coaxial and core shell structures. The invention covers a wide area of applications ranging from nanoelectronics, smart sensing elements/transducers, catalysis, optical transducers and antennas. Controlling the nanometal localization inside a micro and nano structures further allows its application as precise bimolecular sensor and even single bio-molecule or cell sensor.

Keyword:

Nanometal-carbon composite, heterogeneous nucleation, photo-cross-linking, micro/nano bulb, metal carbon sandwich, metal carbon coaxial.

BACKGROUND

Well-dispersed functional nanoparticles (NPs) in a conductive carbon host are particularly important for sensors applications. Electrochemical energy storage, electrochemical catalysis, and photocatalysis, among other applications. The conductive support cannot only effectively transport electrons and heat generated during electrochemical reactions, but also disperse the nanoparticles from severe aggregation. Along with that, presence of nano-structures on the surface provides a perfect platform for the chemical and biological functionalization. The chemical functionalization of the surface includes biodegradable/non-biodegradable polymers, dyes, therapeutic chemicals, and lipids, cationic/ionic resins, cheating agents, complexation moieties etc. and combinations thereof. The biological functionalization of the surface include proteins, enzymes, antibodies, antigens, peptides, aptamers, nucleotides, nucleotides, human/animal origin cells, microbes, viruses etc. and combinations thereof. Two main strategies have been developed for the synthesis of NPs decorated on carbon-based materials, which includes "synthesis-then-assembly" and in situ growth. For synthesis-then-assembly methods, a suspension of synthesized nanoparticles are introduced to the porous carbon matrix by impregnation and then drying. More often, the NPs are prepared in situ on a carbon support via chemical reduction or hydrothermal reaction as a simple and low-cost method, and sometimes via physical methods, such as electron beam radiation and selective surface functionalization. Since carbon is non-wetting with most metals and the interaction between metal NPs and carbon surface is, weak the as-formed nanoparticles are prone to agglomerate and redistribute during the synthesis and post heat treatments.

As the growth and aggregation of nanoparticles are time dependent diffusion and migration processes, it is critical to synthesize ultrafine NPs over a short time and quench the process to prevent or, at least, minimize agglomeration. While conventional high temperature synthesis methods, such as spray pyrolysis and combustion, are fast (several seconds to minutes), a well controllable heating method is desirable for the control of both the high temperature heating process and also the resultant particle size and distribution.

The arrangement of nanoparticles in a specific dimension and position is key for their unique electrical, optical, magnetic properties and the phenomena such as light propagation in nanoparticles crystals and plasmonic resonance. For the optimization of device performance, crucial parameters include the nanoparticle size—and the inter particle distance, as well as the arrangement controlling the coupling effects. Recent developments in self-assembly techniques have opened interesting perspectives to create motifs with desirable inter-particle distance. Methods such as reverse micelles, microemulsions, Langmuir Blodgett films, organometallic techniques, and two-phase liquid-liquid systems have been used for 2D nanoparticle patterning on a substrate. Other techniques, such as micro-contact printing, direct deposition by photochemical decomposition and ink-jet printing, offer a valuable complement for fabrication. Among all architectures, the 3D arrangement of nanoparticles remains one of the most challenging goals due to stabilization problems. In order to create a mechanically robust 3D structure, nanoparticles must first be arranged through successive self-assembly and then sintered at elevated temperature. Another approach for the formation of stable 3D arrangements of nanoparticles with proper inter-particle distances to embed them in a matrix, typically a polymer. This approach has limitations due to the complicated dispersion of nanoparticles in a viscous polymers or the aggregation of nanoparticles.

Fabrication of metallic nano-structures with in a dielectric host material allows the optical response of the composite material to be tailored, potentially achieving responses not possible in a homogeneous material. Most experimentally realized negative index metamaterials have been fabricated using "top-down" lithographic techniques, usually either electron beam lithography (EBL) or focused-ion-beam lithography (FIBL). Although these approaches can provide resolution on the scale of a few nanometers, they are inherently serial in nature and are limited to the fabrication of relatively small samples, typically with high-cost and low-throughput. A more recent approach to meta-materials involves direct laser writing in a polymeric structure followed by metal evaporation over the fabricated surface. While this method is promising, full metal coverage is challenging. A need exists for new fabrication methods that overcome the aforementioned limitations.

BRIEF DESCRIPTION OF EACH FIGURE

FIG. 1. Schematic of the basic mechanism representing the use of focused energy beam to create heterogeneous nucleation sites.

FIG. 2. Schematic of the Nano-bulb fabrication process on a nanofiber.

FIG. 3. Schematic of the nano-metal writing on precursor thin films.

FIG. 4. Scanning electron microscopy of the gold Nano-bulbs fabricated in the carbon nanofibers.

FIG. 5. Nanometal decorated nanogaps created by two different methods where the properties and surface composition of nanogaps is controlled by inducing metal accumulated nanogaps in the center of suspended carbon based nanofiber.

DETAILED DESCRIPTION OF THE INVENTION

This invention opens a new prospective of controlling and localizing the metal nanoparticles nucleation and growth on as well as inside a substrate. The process relies on a precise pretreatment of the precursor substrate mixture with a focused energy beam. The localization and accumulation of the nano-metals is an in situ process during the carbonization of the pretreated substrate. This invention allows the selective growth of Nano metals in situ during the transformation of the metal-carbon substrate into a nanometal carbon composite. The process require a pretreatment process with focused energy beam to create heterogeneous nucleation sites in the metal-carbon substrate.

Writing metal structures or fabricating metal Nano structures inside a solid matrix is a challenging process. Researchers are using intense energy beam to reduce metal precursor salts inside these solid or semisolid substrates. These processes are very harsh, non-uniform and may damage the substrate properties. A much easier solution is required to control and localize this nanometal fabrication in a solid matrix like carbon, which will further allow to reach the fabrication of structures like metal carbon based Nano bulbs, sandwiches and coaxial/core shell structures. Similar procedure. The problem relies in the fact that all the researchers have tried the complete reduction of metal precursors using high intensity/energy sources. No such research is reported where passive accumulation of Nano metals is tried during the process of substrate transformation.

Carbon MEM/NS (Microstructure and Nanostructures) Fabrication

This invention includes the fabrication of C-MEMS microstructure and nano-structures scaled microelectronic devices for wide range of application. One of the most prominent application of this invention is the writing of predefined patterns of metals/nano metals in a solid carbon matrix. These microstructures are created by pretreating the photo cross-linking polymer precursor containing metal precursor to create selective nucleation (by virtue of site selective reduction of metal precursor) as well as creation of secondary heterogeneous nucleation and growth platform. This heterogeneous nucleation sites further determines the patterning of the nanometal structures inside the transforming carbon precursor from a polymer state to solid carbon matrix during the process of high temperature carbonization. As explained in FIG. 1, the heterogeneous nucleation sites creation are responsible for the relatively higher nucleation and growth of metal nano-structures. Diffusion rate of reduced metal ions during the growth of nanostructure is highly dependent on the concentration of metal ions and the diffusivity/porosity of the surrounding matrix. This invention reports the selective accumulation of metal ions around the self-created heterogeneous sites resulting in the creation of 2D and 3D nano and microstructures inside the solid carbon matrix. These structures are represented as nano/micro bulb created on the suspended micro or nano fibers/wires and writing with the nano/micro metal structures on the surface and even inside the carbon matrix FIGS. 2, 3 and 4. 2D and 3D pretreatment using selective energy source are used to create metal carbon sandwich structures and coaxial structure of metal and carbon fibers/wires. Invention also presents the fabrication of nano metals/metal pointed nanogaps fabricated on the suspended nanofibers/wires. In molecular electronics, individual molecules are integrated with the rest of the circuit by positioning them in electrode gaps of the order of the molecule size. Such nanoscale gaps (nanogaps) have emerged as important experimental platforms for the electrical characterization of molecules, capturing unique transport phenomena of both organic and inorganic materials. These nanogaps are created using the metal-carbon composite fibers/wires, which are designed to have an accumulated metal/nanometal region at a certain region of the suspended nano fiber/wire FIG. 5.

The invention claimed is:

1. A method for selective accumulation of nano-metals particles in a composite, the method comprising:
   providing a mixture of a photoresist and a metal salt embedded within the photoresist,
      wherein the metal salt is selected from the group consisting of titanium oxide, zinc oxide, silicon oxide, aluminum oxide, aluminum nitride, copper oxide, iron oxide, and combinations thereof, and
      wherein the mixture in the form of a solid or semisolid thin film, a nano/micro fiber, a suspended nano/micro wire, flakes, powder, or a nano/micro electrode;
   applying focused energy to a localized region of the mixture, wherein the focused energy is selected from the group consisting of a focused electron beam, one or more photon beams, ultraviolet and infrared wavelength exposure, and combinations thereof, in order to
      reduce the metal salt embedded in the mixture in the localized region, and
      cross-link the photoresist in the localized region, thereby creating secondary heterogeneous nucleation sites for spontaneous synthesis and growth of nano-metal particles.

2. The method according to claim 1, further comprising biologically functionalizing the composite so that a surface of the composite comprises proteins, enzymes, antibodies, antigens, peptides, aptamers, nucleotides, human/animal origin cells, microbes, viruses, or combinations thereof.

3. The method according to claim 1, further comprising chemically functionalizing the composite so that a surface of the composite comprises polymers, dyes, therapeutic chemicals, lipids, cationic/ionic resins, chelating agents, complexation moieties, or combinations thereof.

4. The method according to claim 1, wherein the composite presents surface conductivity, bulk conductivity, capacitance, and surface kinetics.

5. The method according to claim 1, wherein the composite material is biocompatible.

* * * * *